(12) United States Patent
Jeong et al.

(10) Patent No.: US 7,286,413 B2
(45) Date of Patent: Oct. 23, 2007

(54) NON-VOLATILE MEMORY DEVICE AND METHOD OF PROGRAMMING SAME

(75) Inventors: Jae-Yong Jeong, Yongin-si (KR); Heung-Soo Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/257,074

(22) Filed: Oct. 25, 2005

(65) Prior Publication Data

US 2006/0087891 A1    Apr. 27, 2006

(30) Foreign Application Priority Data

Oct. 26, 2004   (KR) ...................... 10-2004-0085749
Nov. 5, 2004    (KR) ...................... 10-2004-0089952

(51) Int. Cl.
*G11C 16/04* (2006.01)
*G11C 16/06* (2006.01)
(52) U.S. Cl. .............................. 365/185.28; 365/185.23
(58) Field of Classification Search ............ 365/185.28
See application file for complete search history.

(56) References Cited

U.S. PATENT DOCUMENTS

| | | | | |
|---|---|---|---|---|
| 5,712,815 A | * | 1/1998 | Bill et al. ............... | 365/185.03 |
| 6,108,238 A | * | 8/2000 | Nakamura et al. ..... | 365/185.22 |
| 6,172,917 B1 | * | 1/2001 | Kataoka et al. ........ | 365/189.05 |
| 6,373,748 B2 | * | 4/2002 | Ikehashi et al. ....... | 365/185.22 |
| 6,525,961 B2 | * | 2/2003 | Rolandi et al. ........ | 365/185.03 |
| 6,747,900 B1 | | 6/2004 | Park et al. | |
| 6,853,585 B2 | * | 2/2005 | Lee et al. ............... | 365/185.22 |
| 7,038,949 B2 | * | 5/2006 | Chae et al. ............. | 365/185.23 |
| 7,110,292 B2 | * | 9/2006 | Hahn et al. ............. | 365/185.03 |
| 7,158,418 B2 | * | 1/2007 | Chae et al. ............. | 365/185.23 |
| 2003/0021144 A1 | | 1/2003 | Kodama | |

FOREIGN PATENT DOCUMENTS

| | | |
|---|---|---|
| JP | 63-052399 | 3/1988 |
| JP | 09-213913 | 8/1997 |
| KR | 1020010003221 | 1/2001 |
| KR | 1020010018711 | 3/2001 |
| KR | 1020040051693 | 6/2004 |

\* cited by examiner

*Primary Examiner*—Son L. Mai
(74) *Attorney, Agent, or Firm*—Volentine & Whitt, PLLC

(57) ABSTRACT

Disclosed are a non-volatile memory device and a method of programming the same. The method comprises applying a wordline voltage, a bitline voltage, and a bulk voltage to a memory cell during a plurality of program loops. In cases where the bitline voltage falls below a first predetermined detection voltage during a current program loop, or the bulk voltage becomes higher than a second predetermined detection voltage, the same wordline voltage is used in the current programming loop and a next program loop following the current program loop. Otherwise, the wordline voltage is incremented by a predetermined amount before the next programming loop.

21 Claims, 9 Drawing Sheets

(Vt : VBL detecting level)

NON-VOLATILE MEMORY DEVICE AND METHOD OF PROGRAMMING SAME

BACKGROUND OF THE INVENTION

1. Field of the Invention

The present invention relates generally to an electronic memory device. More particularly, the invention relates to a non-volatile memory device and a method of programming the same.

A claim of priority is made to Korean Patent Applications Nos. 2004-85749 and 2004-89952 respectively filed on Oct. 26, 2004 and Nov. 5, 2004, the disclosures of which are hereby incorporated by reference in their entirety.

2. Description of the Related Art

Semiconductor memories are an essential part of most modern electronic systems such as computers and other digital logic platforms. Unfortunately, however, the performance of the electronic systems is often limited by the speed and the capacity of the semiconductor memories. In addition, the physical size of memory chips often places a restriction on the amount of miniaturization that can take place in the electronic systems. Because of the limiting effect that semiconductor memories have on modem electronic systems, there is a continuing need to create faster, more highly integrated semiconductor memories. In order to do so, improvements need to be made to the manufacturing technologies used to create these memories. In particular, processing techniques for creating more densely integrated, higher frequency semiconductor memories need to be developed.

Semiconductor memory devices are generally grouped into two broad categories: volatile semiconductor memory devices and non-volatile semiconductor memory devices. Briefly, volatile semiconductor memory devices provide persistent data storage as long as power is supplied to the devices, but they lose the data once the power is cut off. Non-volatile semiconductor memory devices, on the other hand, provide persistent data storage even when power to the devices is cut off or suspended.

Because of their ability to provide persistent data storage even when power is cut off, non-volatile memory devices are commonly used to provide long term storage for data such as program files and microcode. Non-volatile memory devices are frequently used in application areas such as personal computers, aerospace electronic engineering, communication systems, and consumer electronics.

Some non-volatile semiconductor memories are adapted for reprogramming and others are not. For example, due to design limitations, mask-programmed read-only memory (MROM) and programmable read-only memory (PROM) can be programmed only once during their lifetime. Erasable programmable read-only memory (EPROM) can be reprogrammed, but only after exposing it to ultraviolet light for several minutes to erase previously stored data. Electrically erasable programmable read-only memory (EEPROM), on the other hand, provides efficient reprogramming capability by allowing memory cells to be reprogrammed by simply applying electric fields to the cells. EEPROMs can generally be reprogrammed more than one hundred thousand times during their lifetime.

Flash memory is a special type of EEPROM in which multiple memory blocks are erased or programmed by a single programming operation. The performance of flash memory is generally superior to that of normal EEPROM, which only allows one memory block to be erased or programmed at a time. In addition, flash memory provides fast access times for read operations and is resistant to physical shock, thus making it an attractive option for high performance portable devices such as cellular phones and personal digital assistants (PDAs).

A typical flash memory comprises an array of transistors called cells, wherein each cell has a source and a drain formed on a substrate and two gate structures formed on the substrate between the source and the drain terminals. The two gate structures generally comprise a floating gate surrounded by an insulating layer and a control gate formed on the floating gate. The floating gate is used to store electrons determining a logic state for the cell.

A flash memory cell is read by placing a voltage on its control gate and detecting whether a current flows between its drain and source. Depending on how many electrons are stored in the floating gate, the voltage applied to the control gate will either allow current to flow between the drain and the source or it will not. For example, where a large number of electrons is stored in the floating gate, the electrons have a canceling effect on the voltage applied to the control gate, thereby affecting whether current flows between the drain and the source. In other words, the electrons stored in the floating gate modify the threshold voltage of the cell, i.e. the voltage that has to be applied to the control gate in order for current to flow between the drain and the source.

Due to variations in flash memory cells such as their geometry or a voltage used to program the memory cells, there tends to be variation in the threshold voltages of flash memory cells that have been programmed. Where the variation in the threshold voltages of the memory cells is not properly regulated, it can cause the flash memory to have poor performance.

In order to regulate a threshold voltage distribution for programmed memory cells, the memory cells are generally programmed using an incremental step pulse programming (ISPP) scheme such as that illustrated by FIG. 1. Referring to FIG. 1, a programming voltage $V_{WL}$ is applied to a wordline. Programming voltage $V_{WL}$ is increased in multiple program loop iterations executed during a programming operation. Each program loop comprises a programming period and a program verification period. In each program loop, programming voltage $V_{WL}$ is incremented by an amount $\Delta V$. During the programming operation, a threshold voltage Vt of a cell being programmed increases by amount $\Delta V$ in each program loop. In order to minimize variation in the threshold voltage distribution, amount $\Delta V$ should be small. As increment $\Delta V$ becomes smaller, the number of program loops becomes larger. Since there is a tradeoff between the number of program loops required and the variance of the threshold voltage distribution, $\Delta V$ should be chosen to minimize the variance of the threshold voltage as much as possible without significantly limiting the performance of the memory device by requiring too many program loops.

A programming scheme for a non-volatile memory device using ISPP is disclosed, for example, in U.S. Pat. No. 6,266,270. Circuits for generating programming voltages using ISPP are disclosed, for example, in U.S. Pat. No. 5,642,309 and in Korean Patent Publication No. 2002-39744.

As described above, when programming a NOR flash memory device using an ISPP scheme, a wordline voltage (e.g., 3V to 10V, $\Delta V$=0.3V) is applied to a control gate of a flash cell, a bitline voltage of about 5V-6V is applied to the drain of the flash cell and a voltage lower than 0 (e.g., −1V) is applied to a bulk or substrate of the flash cell. In general, a cell current $I_{cell}$ flowing through a memory cell is proportional to $(V_{GS}-V_t)^2$, where $V_t$ is a threshold voltage of the memory cell and $V_{GS}$ is a gate to source voltage of the memory cell. The bitline voltage is generated and maintained by a charge pump (not shown). Where an amount of cell current flowing through the memory cell exceeds the capacity of the charge pump for the bitline voltage, the bitline voltage falls below a predetermined voltage level. As the bitline voltage (i.e. the drain voltage) is decreased, the threshold voltage of the flash cell fails to increase by a desired amount during a programming operation as indicated by a broken line in FIG. 1. In particular, as successive program loops are executed according to an ISPP scheme, a difference between the threshold voltage of the flash cell and the wordline voltage steadily increases. As a result, various characteristics of programmed cells are degraded, or programming failures may occur.

Similar to the bitline voltage, a bulk voltage is also generated and maintained by a charge pump (not shown). Where an amount of a cell current flowing through the memory cell exceeds an amount of a charge pump for the bulk voltage, the bulk voltage is increased above a predetermined voltage. As the bulk voltage increases above the predetermined voltage, the threshold voltage of the flash cell fails to increase by a desired amount during a programming operation as indicated by the broken line in FIG. 1. In particular, as successive program loops are executed according to an ISPP scheme, a difference between the threshold voltage of the flash cell and the wordline voltage steadily increases. As a result, various characteristics of programmed cells are degraded, and programming failures may occur.

Accordingly, a new approach capable of preventing programming failures caused by an increased bulk voltage or a decreases bitline voltage is desperately needed.

SUMMARY OF THE INVENTION

According to one embodiment of the present invention, a method of programming a non-volatile memory device is provided. The method comprises applying a wordline voltage and a bitline voltage to a memory cell of the non-volatile memory device, detecting whether the bitline voltage falls below a predetermined detection voltage during a first programming period associated with a first program loop, and determining programming conditions for a second programming period associated with a second program loop following the first program loop based on a result of the detection.

According to another embodiment of the present invention, a method of programming a non-volatile memory device comprises applying a wordline voltage, a bitline voltage, and a bulk voltage to a memory cell of the non-volatile memory device, detecting whether the bulk voltage becomes higher than a predetermined detection voltage during a first programming period associated with a first program loop, and determining programming conditions for a second programming period associated with a second program loop following the first program loop based on a result of the detection.

According to yet another embodiment of the present invention, a method of programming a non-volatile memory device comprises performing a plurality of program loops, where each programming loop includes a programming period and a program verification period. In this method, programming conditions for a second program loop following a first program loop are determined based on whether a program condition was met for the first program loop. The programming conditions for the second program loop are caused to be the same as the programming conditions used in the first program loop in cases where the program condition is satisfied for the first program loop. Otherwise, the programming conditions for the second program loop are caused to be different than the programming conditions used in the first program loop. Typically, this involves incrementing a wordline voltage for the second program loop.

According to yet another embodiment of the present invention, a non-volatile memory device is provided. The device comprises a first voltage generating circuit generating a first voltage applied to a memory cell in the non-volatile memory device, a second voltage generating circuit generating a second voltage applied to the memory cell, and a control circuit generating a control signal having a logic state that depends on whether the second voltage falls below a predetermined detection voltage during a first programming period associated with a first program loop. The control circuit controls the first voltage generating circuit such that the first voltage is generated at the same level during a second programming period associated with a second program loop following the first program loop in cases where the second voltage falls below the predetermined detection voltage during the first programming period.

According to another embodiment of the present invention, a non-volatile memory device comprises a first voltage generating circuit generating a first voltage applied to a memory cell in the non-volatile memory device, a second voltage generating circuit generating a second voltage applied to the memory cell, and a control circuit. The control circuit generates a control signal having a logic state that depends on whether the second voltage becomes higher than a predetermined detection voltage during a first programming period associated with a first program loop. The control circuit controls the first voltage generating circuit such that the first voltage is generated at the same level during a second programming period associated with a second program loop following the first program loop in cases where the second voltage becomes higher than the predetermined detection voltage during the first programming period.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
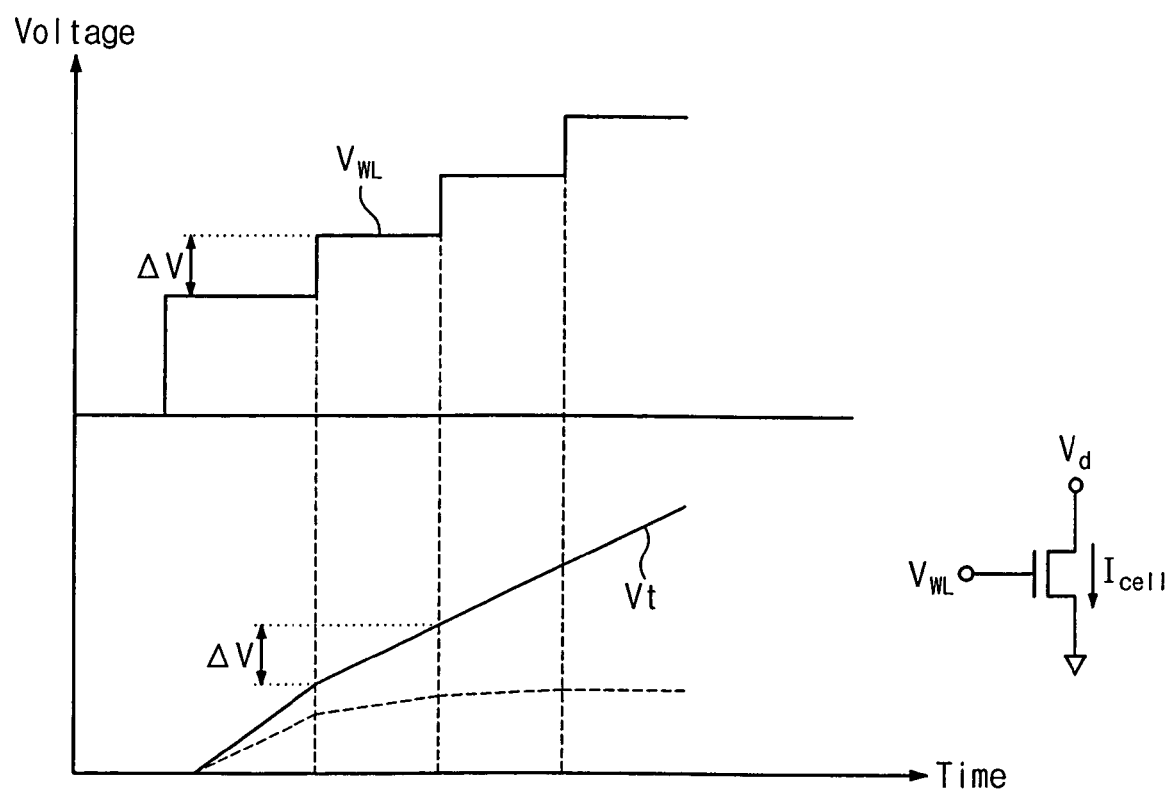
FIG. 1 is a graph showing variation in wordline and threshold voltages during a programming operation of a non-volatile memory device.
Figure 2:
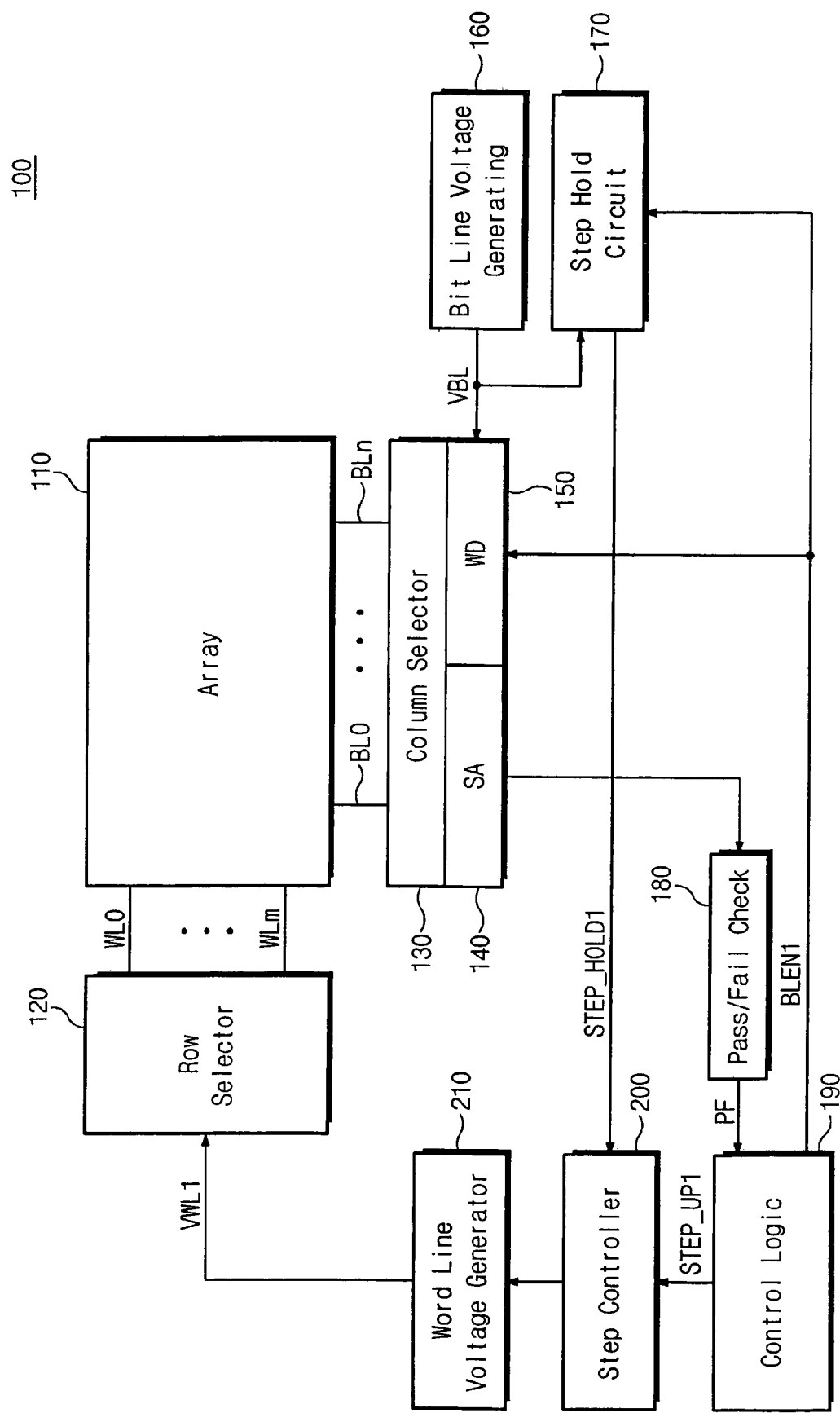
FIG. 2 is a schematic block diagram illustrating a non-volatile memory device according to a first embodiment of the present invention.
Figure 7:
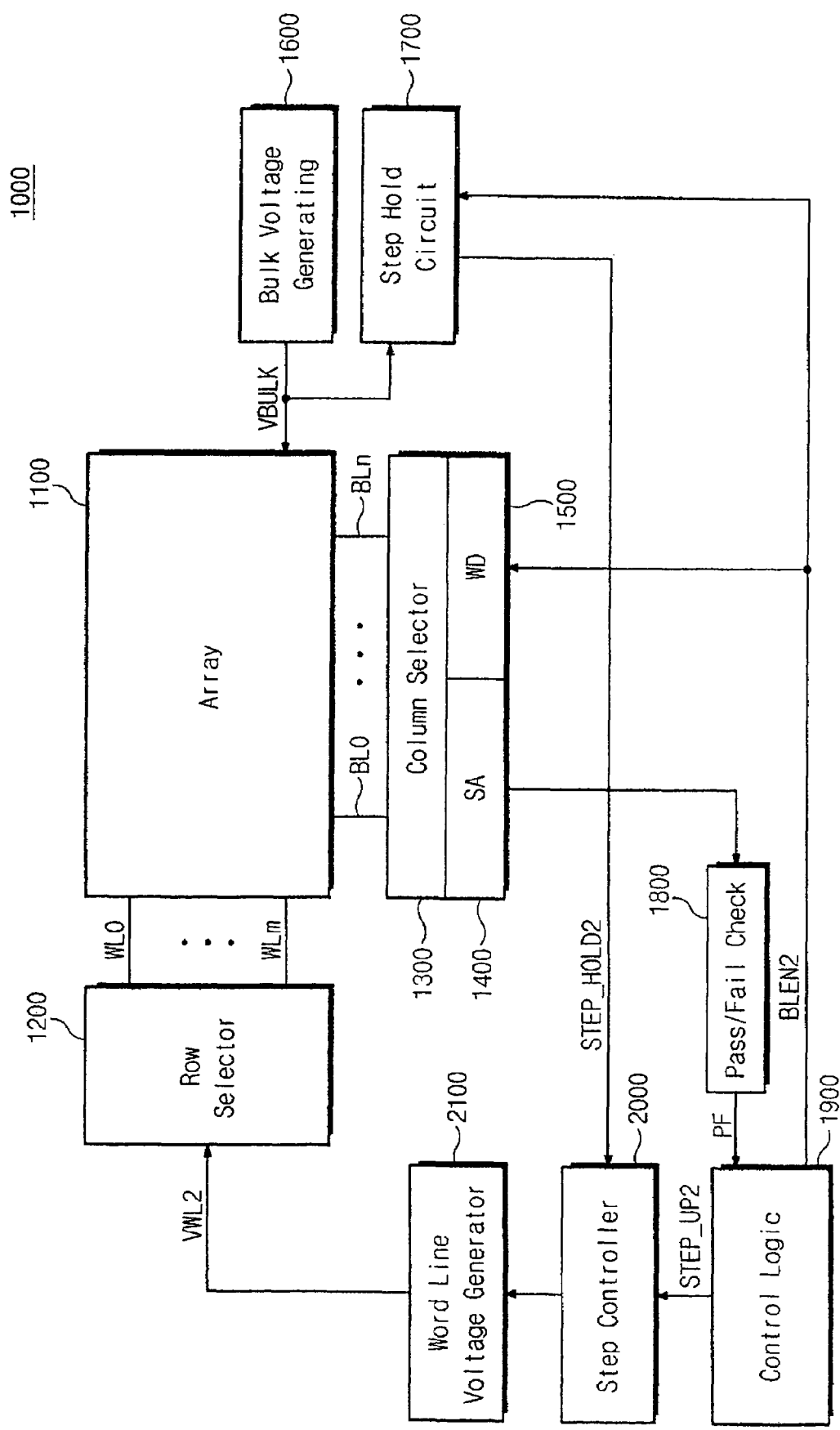
FIG. 7 is a schematic block diagram illustrating a non-volatile memory device in accordance with a second embodiment of the present invention.

FIGS. 2 and 7 are schematic block diagrams illustrating a non-volatile memory device according to various embodiments of the present invention. Although the non-volatile memory devices shown in FIGS. 2 and 7 are NOR flash memory devices, the invention can also be embodied by other types of non-volatile memory, such as masked read-only memory (MROM), programmable read-only memory (PROM), ferroelectric random-access memory (FRAM), NAND flash memory, etc.

In a non-volatile memory device, a programming operation typically comprises a plurality of program loops, each of which comprises a programming period and a program verification period. During the programming period, input data is programmed to selected memory cells, and during the program verification period, it is determined whether the selected memory cells were correctly programmed. In a non-volatile memory device using an ISPP scheme, as the plurality of program loops is executed, a wordline voltage is gradually increased by a predetermined amount during each loop until a desired threshold voltage is attained for selected memory cells.

Referring to FIG. 2, a non-volatile memory device 100 comprises a memory cell array 110 having memory cells arranged in a matrix along rows or wordlines WL0-WLm and columns or bitlines BL0-BLn. A row selection circuit 120 selects one of wordlines WL0-WLm in accordance with predetermined row address information, and drives a wordline with a wordline voltage VWL1 supplied by a wordline voltage generating circuit 210. A column selection circuit 130 selects bitlines BL0-BLn in a unit, e.g., a word or a byte, in accordance with predetermined column address information.

A sense amplifying circuit 140 reads data bits from memory cells according to selected wordlines and bitlines. Data bits read by sense amplifying circuit 140 are generally either output to an external circuit or transmitted to a pass/fail inspecting circuit 180 depending on a particular operating mode of the memory device. For example, where the memory device is in a read operating mode, data bits read by sense amplifying circuit 140 are output to an external circuit. In contrast, where the memory device is in a program operating mode, data bits read by sense amplifying circuit 140 are transmitted to pass/fail inspecting circuit 180.

A write driver circuit 150 operates in response to a bitline enable signal BLEN1 during a program operating mode. During the program operating mode, write driver 150 drives the bitlines selected by column selection circuit 130 with a voltage whose level depends on whether or not data is to be programmed to memory cell array 100 during the program operating mode. For example, where data is to be programmed to memory cell array 100, write driver 150 drives the selected bitlines with a bitline voltage VBL. Otherwise, write driver 150 drives the selected bitlines with a voltage which is lower than bitline voltage VBL, e.g., ground.

A bitline voltage generating circuit 160 generates bitline voltage VBL in response to a control signal from a control logic circuit 190. A step hold circuit 170 operates in response to bitline enable signal BLEN1 and detects whether bitline voltage VBL falls below a predetermined detection voltage during each programming period of each program loop. Step hold circuit 170 generates a step hold signal STEP_HOLD1 according to the level of bitline voltage VBL. For example, where bitline voltage VBL is higher than the detection voltage, step hold circuit 170 deactivates (i.e. sets to a first logic state) step hold signal STEP_HOLD1. However, where bitline voltage VBL falls below the detection voltage established for each programming period, step hold circuit 170 activates (i.e. sets to a second logic state) step hold signal STEP_HOLD1.

During a program verification period, pass/fail inspecting circuit 180 determines whether data bits read by sense amplifying circuit 140 are in a programmed state, and outputs a pass/fail signal PF to control logic circuit 190 according to the result of the determination.

Control logic circuit 190 controls various operations performed by the non-volatile memory device. For example, in a programming operation, control logic circuit 190 activates bitline enable signal BLEN1 during the programming period of each program loop. Then, in the program verification period of each program loop, control logic circuit 190 determines whether the selected memory cells have been completely programmed according to pass/fail signal PF. Where pass/fail signal PF indicates that the selected memory cells have been completely programmed, control logic circuit 190 causes the programming operation to conclude. Usually, this happens after several program loops have been executed. Otherwise, where pass/fail signal PF indicates that the selected memory cells have not yet been completely programmed, control logic circuit 190 causes further program loops to be executed. Once a program verification operation is completed and the programming operation is not concluded, control logic circuit 190 activates a step-up pulse signal STEP_UP1.

A step control circuit 200 receives step-up pulse signal STEP_UP1 and step hold signal STEP_HOLD1 and controls wordline voltage generating circuit 210 such that wordline voltage VWL1 is gradually increased during the programming operation. Where step-up pulse signal STEP_UP1 is activated and step hold signal STEP_HOLD1 is deactivated, step control circuit 200 controls wordline voltage generating circuit 210 so that wordline voltage VWL1 is increased by a predetermined amount relative to its value in a previous program loop. Where step-up pulse signal STEP_UP1 is activated and step hold signal STEP_HOLD1 is also activated, step control circuit 200 controls wordline voltage generating circuit 210 so that wordline voltage VWL1 is maintained at the same value as in the previous program loop. Wordline voltage generating circuit 210 generates wordline voltage VWL1 in response to a control signal from step control circuit 200. An exemplary wordline voltage generating circuit using an ISPP scheme is disclosed, for example, in the aforementioned U.S. Pat. No. 5,642,309, and Korean Patent Publication No. 2002-39744.

As described above, where bitline voltage VBL becomes lower than the predetermined detection voltage during the programming period of a particular program loop, step hold signal STEP_HOLD1 is activated. Where step hold signal STEP_HOLD1 is activated, step control circuit 200 controls wordline voltage generating circuit 210 such that wordline voltage VWL1 stays the same during the programming period of the next program loop. In other words, in a non-volatile memory device using an ISPP scheme, where bitline voltage VBL becomes lower than a predetermined detection voltage, the wordline voltage supplied to selected wordlines is maintained constant during consecutive program loops. This means that memory cells may be programmed two or more times under the same programming condition.

In the embodiment shown in FIG. 2, step hold circuit 170, control logic circuit 190 and step control circuit 200 constitute a control circuit controlling wordline voltage generating circuit 210. The control circuit generates control signals to control wordline voltage generating circuit depending on whether bitline voltage VBL is lower than a predetermined detection voltage.

Figure 3:
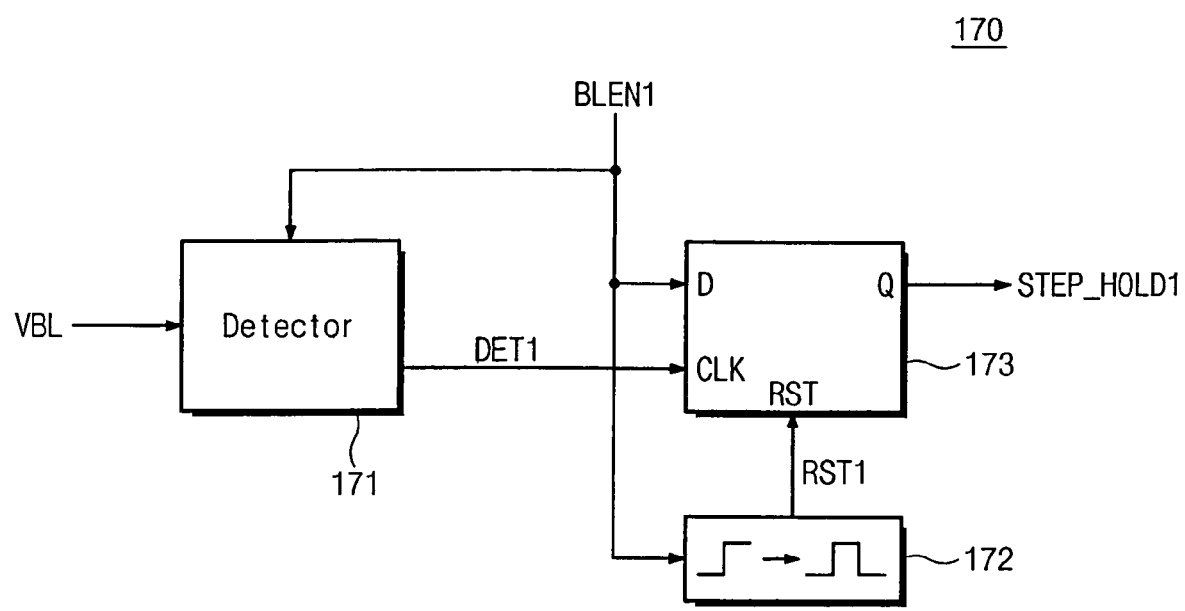
FIG. 3 is a block diagram illustrating a step hold circuit illustrated in FIG. 2.

FIG. 3 is a block diagram showing an embodiment of step hold circuit 170 shown in FIG. 2.

Referring to FIG. 3, step hold circuit 170 comprises a detector 171, a pulse generator 172 and a latch 173. Detector 171, which operates in response to bitline enable signal BLEN1, detects whether bitline voltage VBL is lower than a predetermined detection voltage and generates a corresponding detection signal DET1. Although detector 171 typically operates during an interval where bitline enable signal BLEN1 is activated, detector 171 may instead operate during every programming period. Pulse generator 172 generates an initialization pulse signal RST1 in response to a transition of bitline enable signal BLEN1. Latch 173 has an input terminal "D" receiving a bitline enable signal BLEN1, a clock terminal CLK receiving detection signal DET1, and an output terminal "Q" outputting step hold signal STEP_HOLD1.

Once bitline enable signal BLEN1 is activated, pulse generator 172 generates initialization pulse signal RST1. In response to initialization pulse signal RST1, step hold signal STEP_HOLD1 is initialized to the first logic state. Where bitline enable signal BLEN1 is activated, detector 171 detects whether bitline voltage VBL is lower than the predetermined detection voltage. Where bitline voltage VBL is lower than the predetermined detection voltage, detection signal DET1 is activated and step hold signal STEP_HOLD1 is activated. In response to the activation of detection signal DET1, latch 173 latches bitline enable signal BLEN1.

Once bitline enable signal BLEN1 is deactivated at the end of each programming period, detector 171 is initialized, and as a result, detection signal DET1 is reset to the first logic level.

Figure 4:
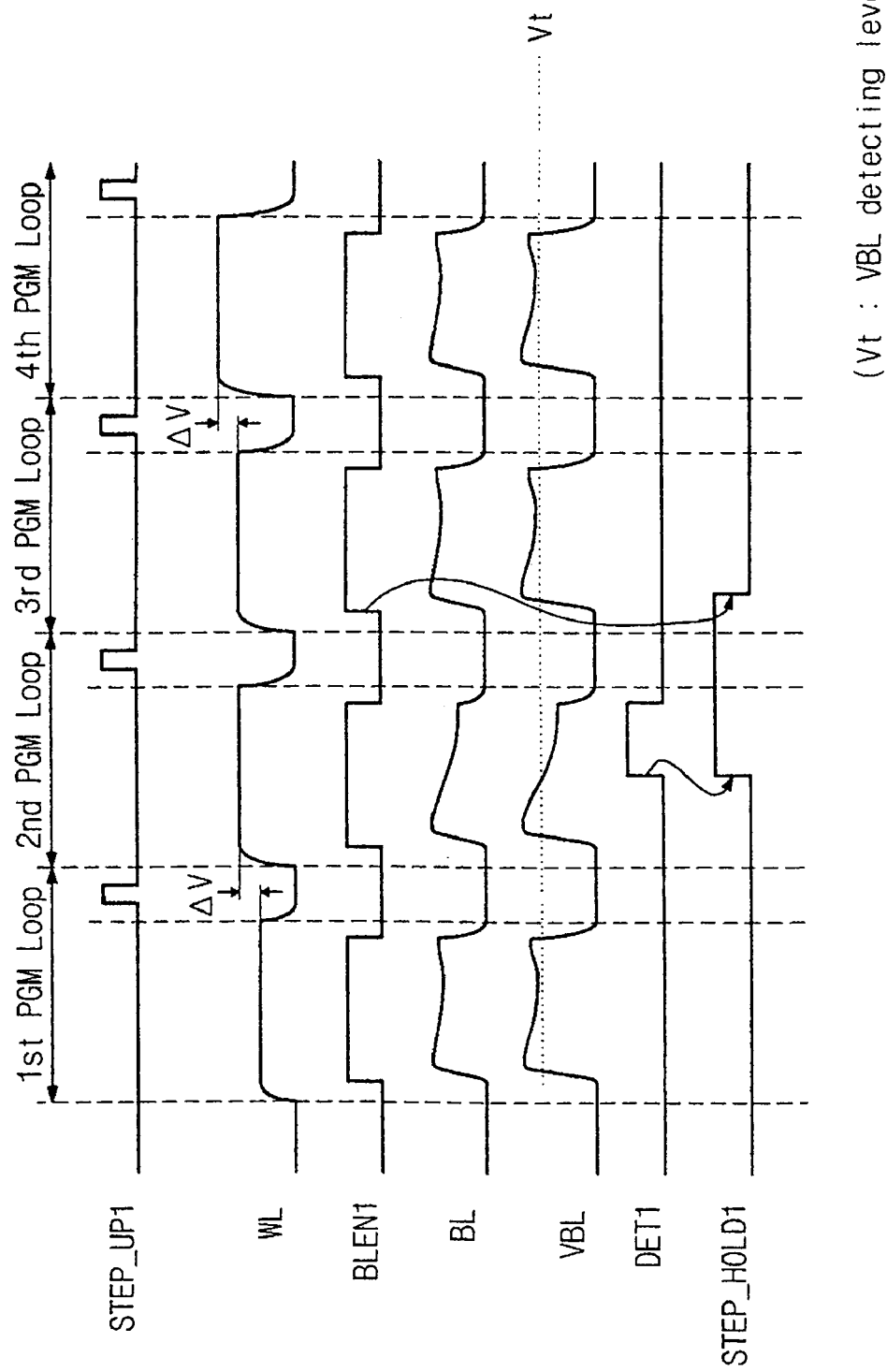
FIG. 4 is a waveform timing diagram for a programming operation of a non-volatile memory device according to the first embodiment of the present invention.

FIG. 4 is a waveform timing diagram illustrating a programming operation for a non-volatile memory device according to one embodiment of the present invention.

Referring to FIG. 4, at the beginning of a programming operation, bitline voltage generating circuit 160 and wordline voltage generating circuit 210 generate bitline voltage VBL and wordline voltage VWL1, respectively, in response to the control signal from control logic circuit 190. Upon the generation of wordline voltage VWL1 and bitline voltage VBL, a programming period of the first program loop is initiated under the control of control logic circuit 190. Control logic circuit 190 controls row selection circuit 120 and activates bitline enable signal BLEN1 so that wordline voltage VWL1 is supplied to a selected wordline. Upon activation of bitline enable signal BLEN1, write driver circuit 150 supplies bitline voltage VBL to bitline(s) selected by column selection circuit 130. Under these conditions, the selected memory cell(s) start to be programmed.

Latch 173 of step hold circuit 170 is initialized in synchronization with the activation of bitline enable signal BLEN1. As a result, step hold signal STEP_HOLD1 is initialized to the first logic state. Once bitline enable signal BLEN1 is activated, detector 171 detects whether bitline voltage VBL is lower than a predetermined detection voltage Vt. As shown in FIG. 4, since bitline voltage VBL is higher than detection voltage Vt during the first programming period, detection signal DET1 stays in the first logic state. As a result, step hold signal STEP_HOLD1 also stays in the first logic state during the first programming period. Next, bitline enable signal BLEN1 is deactivated and the selected wordline is discharged, thus completing the programming period for a first program loop.

Once the programming period for the first program loop is completed, a program verification period for the first program loop begins. In the program verification period, well known methods are used to determine whether selected memory cells are completely programmed, i.e., whether or not a programming failure has occurred. This is accomplished using sense amplifying circuit 140, pass/fail inspecting circuit 180, and control logic circuit 190. Where pass/fail signal PF indicates that the selected memory cells have not been completely programmed, control logic circuit 190 activates step-up pulse signal STEP_UP1. Step control circuit 200 controls wordline voltage generating circuit 210 in response to step-up pulse signal STEP_UP1 and step hold signal STEP_HOLD1. Since step hold signal STEP_HOLD1 indicates that bitline voltage VBL is higher than the detection voltage during the programming period of the first program loop in FIG. 4, step control circuit 200 controls wordline voltage generating circuit 210 so that wordline voltage VWL1 is increased by a predetermined value ΔV.

Upon starting a second program loop, the above described procedures are repeated. As described above, detector 171 detects whether bitline voltage VBL falls below detection voltage Vt during the programming period of the second program loop. Where bitline voltage VBL falls below detection voltage Vt, detection signal DET1 is activated as seen in the second program loop. Accordingly, step hold signal STEP_HOLD1 output by latch 173 is activated in synchronization with detection signal DET1. Detection signal DET1 is then deactivated in synchronization with bitline enable signal BLEN1, as shown in FIG. 4, thus completing the programming period of the second program loop.

Once the programming period of the second program loop is completed, the program verification period for the second program loop begins. Again, in the program verification period, well-known methods are used to determine whether selected memory cells are completely programmed. This is accomplished using sense amplifying circuit 140, pass/fail inspecting circuit 180, and control logic circuit 190. Where pass/fail signal PF indicates that the memory cells have not been completely programmed, control logic circuit 190 activates step-up pulse signal STEP_UP1. Step control circuit 200 controls wordline voltage generating circuit 210 in response to step-up pulse signal STEP_UP1 and step hold signal STEP_HOLD1. As described above, since step hold signal STEP_HOLD1 indicates that bitline voltage VBL is below detection voltage Vt, step control circuit 200 controls wordline voltage generating circuit 210 so that wordline voltage VWL1 is maintained at the same voltage level as in the previous programming period, i.e., wordline voltage VWL1 is not increased by a predetermined value ΔV.

In a third program loop, a program operation is performed using the above methods. With one exception, the programming conditions used in the third programming period are the same as those used in the second programming period. In other words, wordline voltage VWL1 is maintained at the same level as in the second programming period. However, as shown in FIG. 4, step hold signal STEP_HOLD1 is deactivated upon activation of bitline enable signal BLEN1 in the third programming period. Following the third program loop, a number of program loops are further performed until selected memory cells have a desired threshold voltage, upon which the programming operation is completed.

In conclusion, in the programming period of each program loop, programming conditions for consecutive program loops are determined by whether bitline voltage VBL falls below detection voltage Vt. Accordingly, programming conditions for one program loop may be the same as those of the previous program loop depending on the level of bitline voltage VBL. As a result, programming failures are prevented from occurring due to a decrease in bitline voltage VBL.

Figure 5:
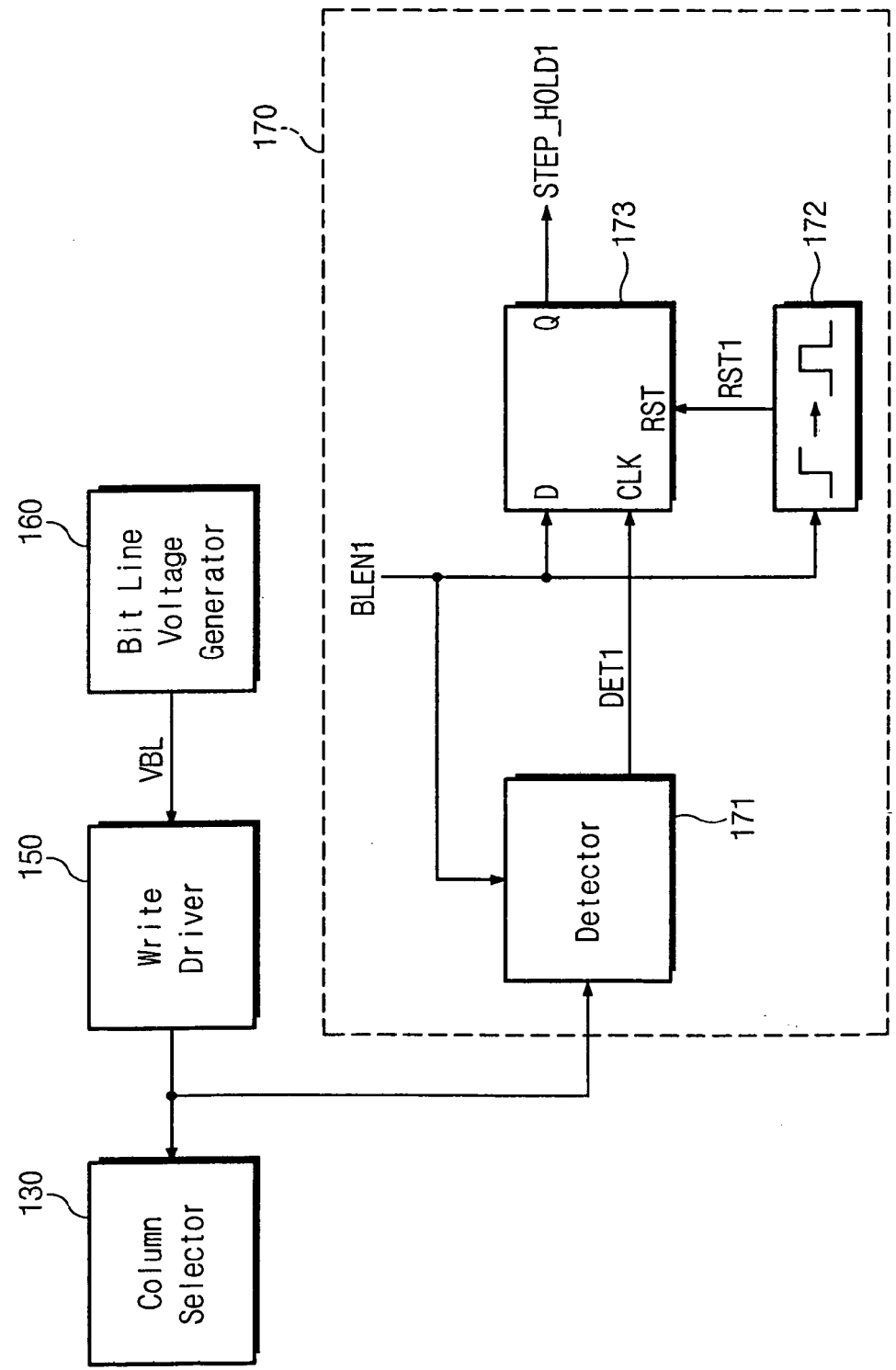
FIGS. 5 and 6 are block diagrams illustrating other embodiments of the step hold circuit illustrated in FIG. 2.
Figure 6:
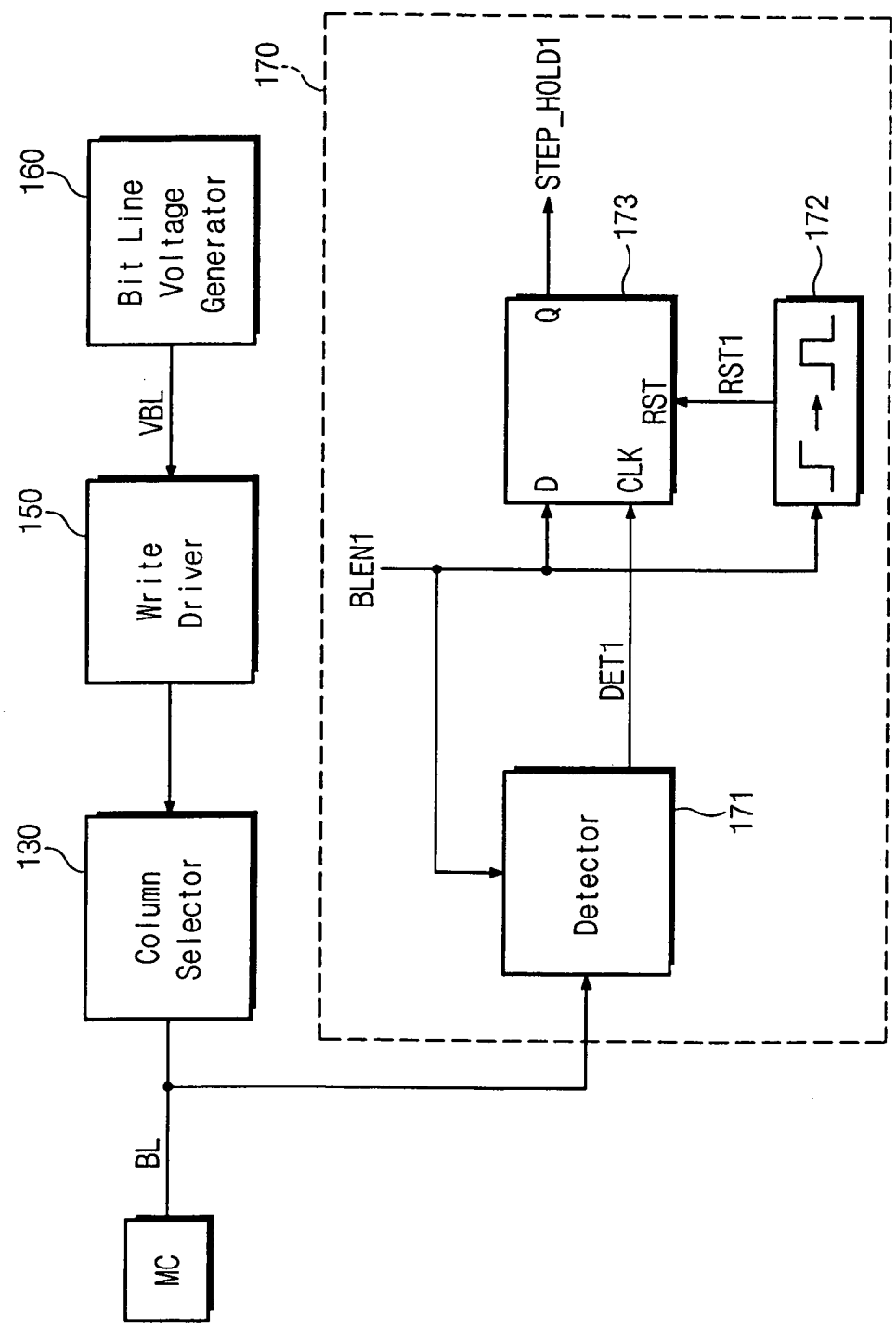

Although step hold circuit 170 shown in FIG. 2 is configured to detect bitline voltage VBL transmitted to write driver circuit 150, it will be apparent to those skilled in the art that the point where step hold circuit 170 detects bitline voltage VBL can be variously modified. For example, as shown in FIG. 5, step hold circuit 170 detects bitline voltage VBL output from write driver circuit 150. Alternatively, as shown in FIG. 6, step hold circuit 170 detects bitline voltage VBL transmitted by column selection circuit 130.

FIG. 7 is a schematic block diagram illustrating a non-volatile memory device according to another embodiment of the present invention. Referring to FIG. 7, a non-volatile memory device 1000 comprises a memory cell array 1100 having memory cells arranged in a matrix along rows or wordlines WL0 -WLm and columns or bitlines BL0-BLn. A row selection circuit 1200 selects one of wordlines WL0-WLm in accordance with predetermined row address information, and drives a wordline with a wordline voltage VWL2 generated by a wordline voltage generating circuit 2100. A column selection circuit 1300 selects bitlines BL0-BLn in a unit (e.g., a word or a byte) in accordance with predetermined column address information. A sense amplifying circuit 1400 reads data bits from memory cells corresponding to the selected wordlines and bitlines. Data bits read by sense amplifying circuit 1400 are typically output to an external circuit or transmitted to a pass/fail inspecting circuit 1800 according to a particular operating mode of the memory device. For example, where the memory device is in a read operating mode, data bits read by sense amplifying circuit 1400 are output to the external circuit. Alternatively, where the memory device is in a program operating mode, data bits read by the sense amplifying circuit 1400 are output to pass/fail inspecting circuit 1800 in a program verification period of a program loop.

During a programming operation of the memory device, bitline enable signal BLEN2 controls write driver circuit 1500 to drive selected bitlines with a voltage whose level depends on whether or not data is to be programmed to memory cell array 1100 or not. For example, where data is to be programmed to memory bitline voltage VBL generated by bitline voltage generating circuit 2200 in accordance with data to be programmed to the memory cells in memory cell array 1100. For example, where data is to be programmed to memory cell array 1100, write driver 1500 drives the selected bitlines with bitline voltage VBL. Otherwise, write driver 150 drives the selected bitlines with a voltage which is lower than bitline voltage VBL, e.g., ground.

A bulk voltage generating circuit 1600 generates a bulk voltage VBULK in response to a control signal from a control logic circuit 1900. A step hold circuit 1700 operates in response to a bitline enable signal BLEN2, and detects whether bulk voltage VBULK becomes higher than a predetermined detection voltage. Step hold circuit 1700 generates a step hold signal STEP_HOLD2 according to the result of the detection. For example, where bulk voltage VBULK is detected to be lower than the predetermined detection voltage during a programming period of a program loop, step hold circuit 1700 deactivates step hold signal STEP_HOLD2. Where bulk voltage VBULK becomes higher than the predetermined detection voltage, step hold circuit 1700 activates step hold signal STEP_HOLD2.

During a program verification period, pass/fail inspecting circuit 1800 determines whether all data bits read by sense amplifying circuit 1400 are in a programmed state, i.e., whether the corresponding memory cells have been completely programmed. Pass/fail inspecting circuit 1800 then outputs a pass/fail signal PF based on the result of the determination.

Control logic circuit 1900 controls various operations performed by the non-volatile memory device. For example, in a programming operation, control logic circuit 1900 activates bitline enable signal BLEN2 during the programming period of each program loop. Then, in the program verification period of each program loop, control logic circuit 1900 determines whether the selected memory cells have been completely programmed according to pass/fail signal PF. Where pass/fail signal PF indicates that the selected memory cells have been completely programmed, control logic circuit 1900 causes the programming operation to conclude. Usually, this happens after several program loops have been executed. Otherwise, where pass/fail signal PF indicates that the selected memory cells have not yet been completely programmed, control logic circuit 1900 causes further program loops to be executed. Once a program verification operation is completed and the programming operation is not concluded, control logic circuit 1900 activates a step-up pulse signal STEP_UP2.

A step control circuit 2000 receives step-up pulse signal STEP_UP2 and step hold signal STEP_HOLD2 and controls wordline voltage generating circuit 2100 so that wordline voltage VWL2 is gradually increased during the programming operation. Where step-up pulse signal STEP_UP2 is activated and step hold signal STEP_HOLD2 is deactivated, step control circuit 2000 controls wordline voltage generating circuit 2100 so that wordline voltage VWL2 is increased by a predetermined amount relative to its value in a previous program loop. Where step-up pulse signal STEP_UP2 is activated and step hold signal STEP_HOLD2 is also activated, step control circuit 2000 controls wordline voltage generating circuit 2100 so that wordline voltage VWL2 is maintained at the same value as in the previous program loop. Wordline voltage generating circuit 2100 generates wordline voltage VWL2 in response to a control signal from step control circuit 2000. An exemplary wordline voltage generating circuit using an ISPP scheme is disclosed, for example, in the aforementioned U.S. Pat. No. 5,642,309, and Korean Patent Publication No. 2002-39744.

As described above, where a bulk voltage VBULK becomes higher than the predetermined detection voltage during the programming period of a particular program loop, step hold signal STEP_HOLD2 is activated. Where step hold signal STEP_HOLD2 is activated, step control circuit 2000 controls wordline voltage generating circuit 2100 such that wordline voltage VWL2 stays the same during the programming period of the next program loop. In other words, in a non-volatile memory device using an ISPP scheme, where bulk voltage VBULK becomes higher than the predetermined detection voltage loop, the wordline voltage supplied to selected wordlines is maintained constant during consecutive program loops. This means that memory cells are programmed two or more times under the same programming condition.

In the embodiment shown in FIG. 7, step hold circuit 1700, control logic circuit 1900 and step control circuit 2000 constitute a control circuit controlling a wordline voltage generating circuit 2100 depending whether bulk voltage VBULK is higher than the predetermined detection voltage.

Figure 8:
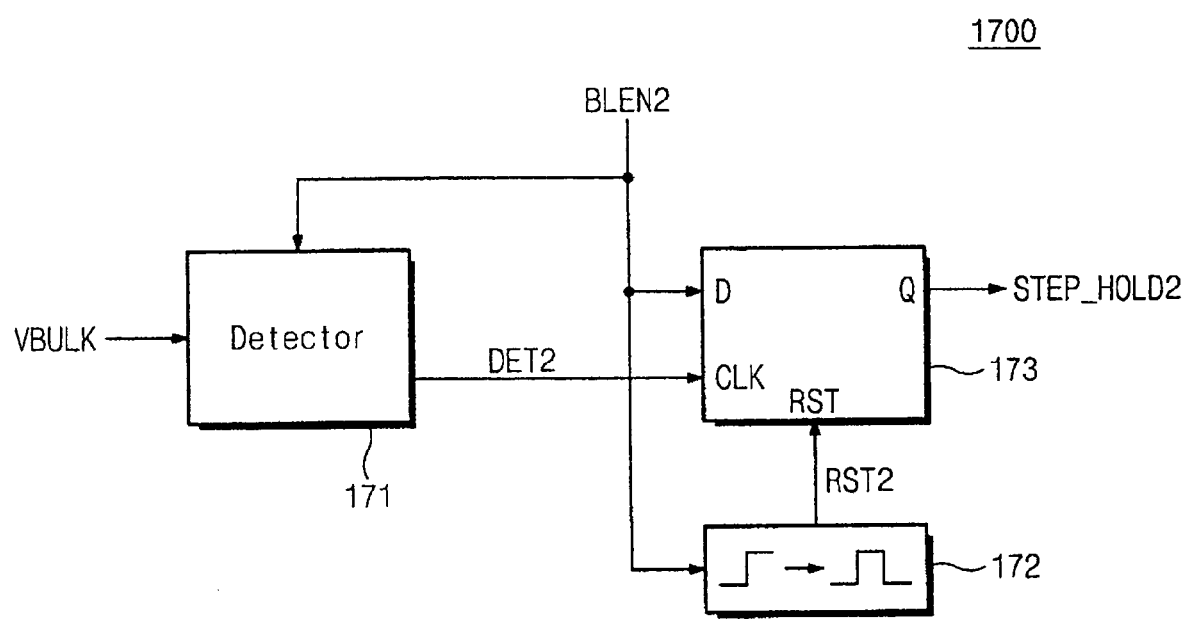
FIG. 8 is a block diagram illustrating a step hold circuit illustrated in FIG. 7; and, FIG. 9 is a waveform timing diagram for a programming operation of a non-volatile memory device according to the second embodiment of the present invention.

FIG. 8 is a block diagram showing an embodiment of step hold circuit 1700 shown in FIG. 7.

Referring to FIG. 8, step hold circuit 1700 comprises a detector 171, a pulse generator 172 and a latch 173. Detector 171, which operates in response to bitline enable signal BLEN2, detects whether bulk voltage VBULK is higher than a predetermined detection voltage and generates a corresponding detection signal DET2. Although in this case, detector 171 operates only while bitline enable signal BLEN2 is activated, it can also be configured to operate during every programming period. Pulse generator 172 generates an initialization pulse signal RST2 in response to a transition of bitline enable signal BLEN2. Latch 173 has an input terminal "D" receiving a bitline enable signal BLEN2, a clock terminal CLK receiving detection signal DET2, and an output terminal "Q" outputting step hold signal STEP_HOLD2.

Once bitline enable signal BLEN2 is activated, pulse generator 172 generates initialization pulse signal RST2. In response to initialization pulse signal RST2, step hold signal STEP_HOLD2 is initialized to the first logic state. Where bitline enable signal BLEN2 is activated, detector 171 detects whether bulk voltage VBULK is higher than the predetermined detection voltage. Where bulk voltage VBULK is higher than the predetermined detection voltage, detection signal DET2 is activated and step hold signal STEP_HOLD2 is activated. In response to the activation of detection signal DET2, latch 173 latches bitline enable signal BLEN2.

Once bitline enable signal BLEN2 is deactivated at the end of each programming period, detector 171 is initialized, and as a result, detection signal DET2 is reset to the first logic level.

Figure 9:
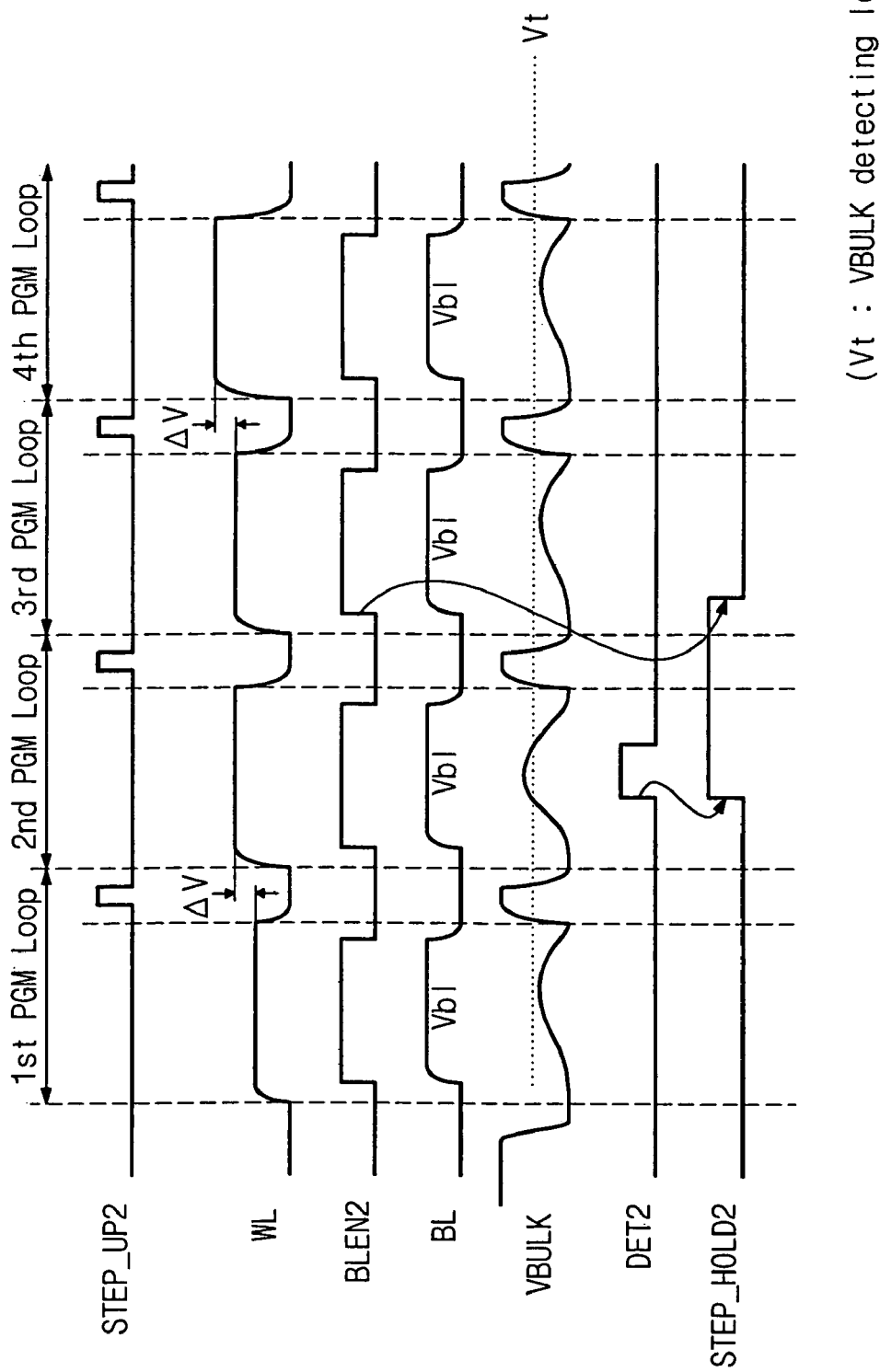

FIG. 9 is a waveform timing diagram illustrating a programming operation for a non-volatile memory device according to one embodiment of the present invention.

Referring to FIG. 9, at the beginning of a programming operation, bulk voltage generating circuit 1600 and wordline voltage generating circuit 2100 generate bulk voltage VBULK and wordline voltage VWL2, respectively, in response to the control signal from control logic circuit 1900. Upon the generation of wordline voltage VWL2 and bulk voltage VBULK, a programming period of the first program loop is initiated under the control of control logic circuit 1900. Control logic circuit 1900 controls row selection circuit 1200 and activates bitline enable signal BLEN2 so that wordline voltage VWL2 is supplied to a selected wordline. Upon activation of bitline enable signal BLEN2, write driver circuit 1500 supplies a bitline voltage to bitline(s) selected by column selection circuit 130 and bulk voltage VBULK is supplied to memory cell array 1100. Under these conditions, the selected memory cell(s) start to be programmed.

Latch 173 of step hold circuit 1700 is initialized in synchronization with the activation of bitline enable signal BLEN2. As a result, step hold signal STEP_HOLD2 is initialized to the first logic state. Once bitline enable signal BLEN2 is activated, detector 171 detects whether bulk voltage VBULK is higher than a predetermined detection voltage Vt. As shown in FIG. 9, since bulk voltage VBL is lower than detection voltage Vt during the first programming period, detection signal DET2 stays in the first logic state. As a result, step hold signal STEP_HOLD2 also stays in the first logic state during the first programming period. Next, bitline enable signal BLEN2 is deactivated and the selected wordline is discharged, thus completing the programming period for a first program loop.

Once the programming period for the first program loop is completed, a program verification period for the first program loop begins. In the program verification period, well known methods are used to determine whether selected memory cells are completely programmed, i.e., whether or not a programming failure has occurred. This is accomplished using sense amplifying circuit 1400, pass/fail inspecting circuit 1800, and control logic circuit 1900. Where pass/fail signal PF indicates that the selected memory cells have not been completely programmed, control logic circuit 1900 activates step-up pulse signal STEP_UP2. Step control circuit 2000 controls wordline voltage generating circuit 2100 in response to step-up pulse signal STEP_UP2 and step hold signal STEP_HOLD2. Since step hold signal STEP_HOLD2 indicates that bulk voltage VBULK is lower than the detection voltage during the programming period of the first program loop in FIG. 9, step control circuit 2000 controls wordline voltage generating circuit 2100 such that wordline voltage VWL2 is increased by a predetermined value ΔV.

Upon starting a second program loop, the above described procedures are repeated. As described above, detector 171 detects whether bulk voltage VBULK becomes higher than detection voltage Vt during the programming period of the second program loop. Where bulk voltage VBULK becomes higher than detection voltage Vt, detection signal DET2 is activated as seen in the second program loop. Accordingly, step hold signal STEP_HOLD2 output by latch 173 is activated in synchronization with detection signal DET2. Detection signal DET2 is then deactivated in synchronization with bitline enable signal BLEN2, as shown in FIG. 9, thus completing the programming period of the second program loop.

Once the programming period of the second program loop is completed, the program verification period for the second program loop begins. Again, in the program verification period, well-known methods are used to determine whether selected memory cells are completely programmed. This is accomplished using sense amplifying circuit 1400, pass/fail inspecting circuit 1800, and control logic circuit 1900. Where pass/fail signal PF indicates that the memory cells have not been completely programmed, control logic circuit 1900 activates step-up pulse signal STEP_UP2. Step control circuit 2000 controls wordline voltage generating circuit 2100 in response to step-up pulse signal STEP_UP2 and step hold signal STEP_HOLD2. As described above, since step hold signal STEP_HOLD2 indicates that bulk voltage VBULK is higher than detection voltage Vt, step control circuit 2000 controls wordline voltage generating circuit 2100 so that wordline voltage VWL2 is maintained at the same voltage level as in the previous programming period, i.e., wordline voltage VWL2 is not increased by a predetermined value ΔV.

In a third program loop, a program operation is performed using the above methods. With one exception, the programming conditions used in the third programming period are the same as those used in the second programming period. In other words, wordline voltage VWL2 is maintained at the same level as in the second programming period. However, as shown in FIG. 9, step hold signal STEP_HOLD2 is deactivated upon activation of bitline enable signal BLEN2 in the third programming period. Following the third program loop, a number of program loops are further performed until selected memory cells have a desired threshold voltage, upon which the programming operation is completed.

In conclusion, in the programming period of each program loop, programming conditions for consecutive program loops are determined by whether bulk voltage VBULK falls below detection voltage Vt. Accordingly, programming conditions for one program loop may be the same as those of the previous program loop depending on the level of bulk voltage VBULK. As a result, programming failures are prevented from occurring due to an increase in bulk voltage VBULK.

As described above, it is possible to prevent program failures from occurring due to a decrease in a bitline voltage or an increase in a bulk voltage. In cases where the bitline voltage rises above a first predetermined detection voltage or the bulk voltage rises above a second predetermined detection voltage, the wordline voltage used to program the memory cells is maintained at the same level during two consecutive program loops.

The foregoing exemplary embodiments are teaching examples. Those of ordinary skill in the art will understand that various changes in form and details may be made to the exemplary embodiments without departing from the scope of the present invention which is defined by the following claims.

What is claimed:

1. A method of programming a non-volatile memory device, the method comprising:
    applying a wordline voltage and a bitline voltage to a memory cell of the non-volatile memory device;
    detecting whether the bitline voltage falls below a predetermined detection voltage during a first programming period associated with a first program loop; and,
    determining programming conditions for a second programming period associated with a second program loop following the first programming loop based on the result of the bitline voltage detection.

2. The method of claim 1, wherein the wordline voltage is applied to the memory cell using an incremental step pulse programming scheme.

3. The method of claim 1, wherein determining programming conditions for the second programming period comprises:
    upon detecting that the bitline voltage falls below the predetermined detection voltage during the first programming period, applying a same wordline voltage as that applied to the memory cell during the first programming period to the memory cell during the second programming period; and,
    upon detecting that the bitline voltage does not fall below the predetermined detection voltage during the first programming period, applying a different wordline voltage from that applied to the memory cell during the first programming period to the memory cell during the second programming period.

4. The method of claim 1, wherein detecting whether the bitline voltage falls below a predetermined detection voltage only occurs when a bitline enable signal is activated.

5. The method of claim 2, wherein detecting whether the bitline voltage falls below a predetermined detection voltage only occurs when a bitline enable signal is activated.

6. The method of claim 2, wherein determining programming conditions for the second programming period comprises:
    upon detecting that the bitline voltage falls below the predetermined detection voltage during the first programming period, applying a same wordline voltage as that applied to the memory cell during the first programming period to the memory cell during the second programming period; and,
    upon detecting that the bitline voltage does not fall below the predetermined detection voltage during the first programming period, applying a different wordline voltage from that applied to the memory cell during the first programming period to the memory cell during the second programming period.

7. A non-volatile memory device, comprising:
    a first voltage generating circuit generating a first voltage applied to a memory cell in the non-volatile memory device;
    a second voltage generating circuit generating a second voltage applied to the memory cell; and,
    a control circuit generating a control signal having a logic state that varies in accordance with a determination of the second voltage level in relation to a predetermined detection voltage during a first programming period associated with a first program loop;
    wherein the control circuit controls the first voltage generating circuit to generate the first voltage at a first voltage level during a second programming period associated with a second program loop following the first program loop where the second voltage falls below the predetermined detection voltage during the first programming period.

8. The device of claim 7, wherein the control circuit controls the first voltage generating circuit to generate the first voltage at a second voltage level different from the first voltage level during the second programming period where the second voltage does not fall below the predetermined detection voltage during the first programming period.

9. The device of claim 8, wherein the first voltage is a wordline voltage, and the second voltage is a bitline voltage.

10. The device of claim 7, wherein the control circuit comprises:
    a control logic circuit activating a step-up pulse signal during each program loop;
    a step hold circuit activating a step hold signal where the second voltage falls below the predetermined detection voltage during the first programming period; and,
    a step control circuit controlling the first voltage generating circuit in response to the step-up pulse signal and the step hold signal.

11. The device of claim 10, wherein the step hold circuit receives the second voltage.

12. The device of claim 10, wherein the second voltage is applied to the memory cell via a bitline and the step hold circuit detects the second voltage on the bitline.

13. The device of claim 10, further comprising a write driver circuit driving the memory cell with the second voltage;
    wherein the step hold circuit detects the second voltage output from the write driver circuit.

14. The device of claim 10, wherein the step hold circuit detects the level of the second voltage in response to a signal output by the control logic circuit during the programming period of each program loop.

15. The device of claim 14, wherein the signal output by the control logic circuit is a bitline enable signal.

16. A method of programming a non-volatile memory device, the method comprising:

performing a first program loop comprising a programming period and a program verification period, wherein the programming period comprises applying a wordline voltage and a bitline voltage to a memory cell in the non-volatile memory device during the first program loop, and detecting whether the bitline voltage falls below a predetermined detection voltage;

determining programming conditions for a second program loop following the first program loop in response to a program condition being satisfied during the first program loop, wherein the program condition is satisfied during the first program loop upon detection of the bitline voltage falling below the predetermined detection voltage.

17. The method of claim 16, wherein the wordline voltage is applied to the memory cell using an incremental step-pulse programming scheme.

18. The method of claim 16, wherein the programming conditions for the second program loop are different from the programming conditions used in the first program loop in cases where the program condition is not satisfied for the first program loop;

wherein the program condition is not satisfied in cases where the bitline voltage does not fall below the predetermined detection voltage during the first program loop.

19. The method of claim 18, wherein different programming conditions for the second program loop in relation to the first program loop are characterized by increasing the wordline voltage by a predetermined amount between the first and second program loops.

20. The method of claim 16, wherein detecting whether the bitline voltage falls below the predetermined detection voltage occurs in response to an activation of a bitline enable signal output by a control logic circuit.

21. The method of claim 16, wherein detecting whether the bitline voltage falls below the predetermined detection voltage occurs during the programming period of each of the plurality of program loops.

* * * * *